United States Patent [19]

Bayruns et al.

[11] Patent Number: 5,646,573
[45] Date of Patent: Jul. 8, 1997

[54] AUTOMATIC GAIN-CONTROL TRANSIMPEDENCE AMPLIFIER

[75] Inventors: Robert J. Bayruns, Middlesex; Timothy M. Laverick, Franklin Park, both of N.J.

[73] Assignee: Anadigics, Inc., Warren, N.J.

[21] Appl. No.: 395,775

[22] Filed: Feb. 28, 1995

[51] Int. Cl.$^6$ .................. H03F 1/34; H03F 3/08
[52] U.S. Cl. ............... 330/59; 330/110; 330/308; 250/214 A
[58] Field of Search ............. 250/214 A; 330/59, 330/110, 308, 86, 282; 359/189, 194

[56] References Cited

U.S. PATENT DOCUMENTS

| | | | |
|---|---|---|---|
| 4,218,613 | 8/1980 | Beltz | 250/214 |
| 4,439,741 | 3/1984 | Turner, Jr. | 330/282 X |
| 4,620,321 | 10/1986 | Chown | 455/619 |
| 4,679,251 | 7/1987 | Chown | 455/619 |
| 5,030,925 | 7/1991 | Taylor | 330/110 X |
| 5,363,064 | 11/1994 | Mikamura | 330/308 |
| 5,371,477 | 12/1994 | Ikeda et al. | 330/282 |

FOREIGN PATENT DOCUMENTS

| | | | |
|---|---|---|---|
| 18304 | 1/1989 | Japan | 330/308 |
| 1-164106 | 6/1989 | Japan . | |
| 4174566 | 6/1992 | Japan | 330/59 |
| 4225611 | 8/1992 | Japan | 330/308 |
| 2096852 | 10/1982 | United Kingdom . | |
| 2101827 | 1/1983 | United Kingdom . | |
| 2233525 | 9/1991 | United Kingdom . | |

OTHER PUBLICATIONS

Methley, S.G., "–70dBm APD Optical Feedback Receiver at 2.048mbit/s" *Electronic letters*, 24:20, pp. 1259–1260, 1988.

Haas, et al., "Low Noise Optical Receiver", *IBM Technical Disclosure Bulletin*, 23:8, pp. 38–45, 1981.

*Primary Examiner*—James B. Mullins
*Attorney, Agent, or Firm*—Pennie & Edmonds LLP

[57] ABSTRACT

Automatic Gain Transimpedance Amplifiers for analog applications having high bandwidth, wide dynamic range, and ultra-high linearity. The transimpedance amplifiers includes an operational amplifier and a variable feedback resistance means connected between the input and the output of the amplifier. The variable feedback resistance means may include a single feedback PIN diode, two serially connected feedback PIN didoes, a PIN diode connected to a feedback resistor in parallel, or two serially connected PIN diodes connected to a feedback resistor in parallel. Ultra-high linearity is achieved because the dynamic resistance of the PIN diode under forward bias is substantially linearly dependent on the inverse of the current that passes the diode.

28 Claims, 8 Drawing Sheets

AUTOMATIC GAIN-CONTROL TRANSIMPEDENCE AMPLIFIER

FIELD OF THE INVENTION

This invention relates to transimpedance amplifiers and more particularly to automatic gain-control transimpedance amplifiers for analog applications.

BACKGROUND OF THE INVENTION

Transimpedance amplifiers are commonly used for providing voltage signal proportional to current signal; they are normally implemented by providing a feedback resistor across the input and output nodes of an operational amplifier.

When utilized in optical communication or optical transmission systems, a transimpedance amplifier converts input optical signal into output voltage signal. In these applications, the optical signal, normally transmitted via optical fibers, is received by a PIN or avalanche photodiode coupled to an input node of the amplifier. The photodiode converts the optical signal into current signal and provides it to the amplifier. Consequently, the amplifier provides at its output terminal voltage signal proportional to the optical signal.

A transimpedance amplifier's merit is directly related to the value of the feedback resistor. For example, the amplifier's sensitivity is proportional to the value of the feedback resistor, whereas the amplifier's bandwidth is inversely proportional to the value of the feedback resistor. Additionally, since the output voltage from the amplifier is a direct product of the input current times the value of the feedback resistor, the amplifier's dynamic range (i.e. the input current the amplifier is capable to handle without incurring significant distortion) is inversely proportional to the value of the feedback resistor.

The dependency of the amplifier's merit on the value of the feedback resistor presents unique problems in optical communication or optical transmission systems. In those applications, it is desirable that the transimpedance amplifiers are fabricated prior to their installation, and that the same kinds of transimpedance amplifiers are used at locations where the optical cables connecting the amplifiers and the optical sources (e.g. lasers or light emitting diodes) are short and at locations where the optical cables are long. Longer optical cables result in greater attenuation of optical signals.

Consequently, if a large value feedback resistor is chosen for high optical sensitivity, the amplifier's bandwidth as well as its dynamic range will be compromised. On the other hand, if a small value feedback resistor is used to obtain large bandwidth and dynamic range, low sensitivity and reduced signal-to-noise ratio results; further, if the value of the feedback resistor is too low, the transimpedance amplifier becomes unstable and begins to oscillate.

When using transimpedance amplifiers for analog optical communications, it is also required that the transimpedance amplifiers exhibit high linearity, i.e. the output signal waveform closely resembles the input signal waveform. This is because, in analog applications, any non-linearity will directly affect the final result (e.g. picture images) of the communications.

U.S. Pat. No. 4,218,613 issued to Bletz discloses a transimpedance amplifier for detecting optical signal. The amplifier includes an operational amplifier, a photodiode having one end connected to the input terminal of the operational amplifier, a feedback resistor connected between the input and output terminals of the operation amplifier, and a diode having non-linear current-characteristics connected in parallel to the feedback resistor. This amplifier offers a greater dynamic range than a conventional transimpedance amplifier because the diode becomes more conductive as the input current increases, which reduces the feedback resistance. However, due to the diode's non-linear current characteristic, distortion in the output signal results.

U.S. Pat. No. 4,620,321 issued to Chown refers to a transimpedance amplifier using an operational amplifier and a Schottky diode ("SD") connected in parallel to a feedback resistor as feedback. The Schottky diode is forward biased and becomes more conductive when the input current increases. However, this amplifier also results in significant non-linear distortion due to the Schottky Diode's non-linear, exponential current characteristics. In addition, the bandwidth of the amplifier is limited by the large capacitance associated with a Schottky diode.

U.S. Pat. No. 4,679,251 issued to Chown discloses a transimpedance amplifier for digital application utilizing an operational amplifier and a resistor connected in parallel to a serially connected Schottky diode and PIN diode as feedback. As a result of the serially connected Schottky and a PIN diode, the bandwidth of the amplifier is improved due to the reduced total feedback capacitance. However, this amplifier still suffers from non-linear distortion as the result of the Schottky diode's non-linear characteristics.

It is therefore an object of the present invention to provide, for analog application, a transimpedance amplifier having a large dynamic range;

it is another object of the present invention to provide a transimpedance amplifier having high linearity;

it is a further object of the present invention to provide a transimpedance amplifier having a wide bandwidth; and it is still a further object of the present invention to provide a transimpedance amplifier with a variable feedback resistance and high linearity.

SUMMARY OF THE INVENTION

The present invention relates to automatic gain control transimpedance ("AGCT") amplifiers for receiving analog optical signal and providing at its output corresponding voltage signal. In a first embodiment, an AGCT amplifier comprises an operational amplifier with its input node operatively coupled to a photodiode and feedback means operatively coupled between the input node and an output node of the operational amplifier. The photodiode operates to convert input optical signal into corresponding current signal and to provide the current signal to the operational amplifier. The feedback means provide feedback resistance that is substantially linearly dependent on the inverse of a DC component of the current signal; consequently, increasing the amplitude of the input optical signal increases the DC component, thereby reducing the feedback resistance. Preferably, the feedback means include a forward biased PIN diode.

In accordance with a second embodiment of the invention, an AGCT amplifier comprises an operational amplifier having input and output nodes with its input node operatively coupled to a photodiode and a feedback branch coupled between the input and output nodes. The feedback branch comprises feedback resistive means connected in parallel to a forward biased feedback PIN diode. Preferably, the feedback resistance means is a resistor. When operating, since the dynamic resistance of the PIN diode is substantially linearly dependent on the inverse of a DC component of the current passing the diode and not on an AC component, increasing the amplitude of the optical signal increases the DC component, thereby reducing the dynamic resistance and the feedback resistance of the feedback branch.

In a third embodiment, an AGCT amplifier comprises an operational amplifier having input and output nodes with its input node operatively coupled a photodiode, and a feedback branch coupled between the input and output nodes. The feedback branch comprises feedback resistive means connected in parallel to serially connected first and second feedback PIN diodes. The polarizations of the PIN diodes are arranged in the same direction and the PIN diodes are forward biased by a DC voltage. The effective dynamic resistance of the serially connected PIN diodes is approximately linearly dependent on the inverse of a DC component of the current passing the PIN diodes. Because of the reduced capacitance associated with the serially connected PIN diodes as compared to a single PIN diode, this amplifier offers a greater bandwidth.

BRIEF DESCRIPTION OF THE DRAWINGS

These and other objects, features and advantages of the invention will be more apparent from the following detailed description in conjunction with the appended drawings in which:

FIG. 2 illustrates a preferred circuit diagram for the embodiment of FIG. 1a;

FIG. 3 depicts a schematic circuit diagram of an alternative embodiment of the transimpedance amplifier of FIG. 1a;

FIG. 4b illustrates a preferred embodiment of the circuit of FIG. 4a; and

DETAILED DESCRIPTION

Figure 1A:
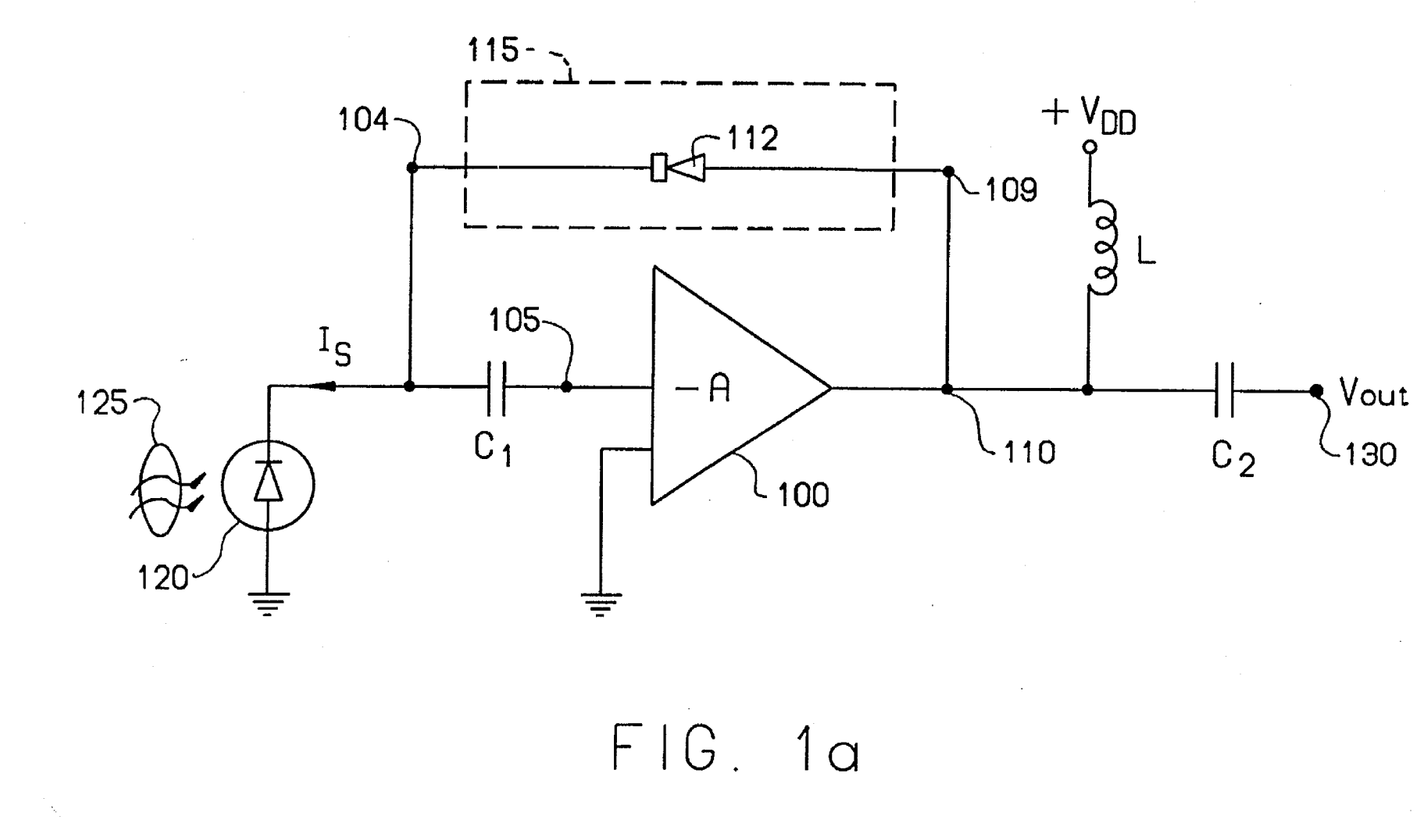
FIGS. 1a–1c depict a schematic circuit diagram of a first embodiment of the transimpedance amplifier and diagrams of exemplary input carrier signal and modulated signal.

As illustrated in FIG. 1a, in a first embodiment of the present invention, an AGCT amplifier for analog applications comprises an operational amplifier 100 having input and output nodes 105 and 110, feedback means 115 having a first terminal 104 capacitively coupled to input node 105 of the operational amplifier through a capacitor $C_1$, and a second terminal 109 operatively connected to output node 110.

A PIN photodiode 120, having one end capacitively coupled to input node 105 of the operational amplifier through capacitor $C_1$ and another end connected to a ground potential, receives analog optical signal 125 and produces corresponding current signal $I_s$.

The analog optical signal, in the context of this application, refers to optical signal that is not a series of digital pulses which represents binary "0" and "1", but optical signal has varying intensity. The waveforms of the analog optical signal may include, but not limited to, sinusoid, or sinusoid with superimposed envelop functions which are utilized in, e.g. Amplitude Modulation (AM).

Feedback means 115 display an effective feedback resistance that is substantially linearly dependent on the inverse of a DC component of $I_s$. Preferably, feedback means 115 comprises a feedback PIN diode 112. The polarization of the feedback PIN diode is from the output node to the input node of the operational the amplifier. The feedback PIN diode is forward biased by a voltage source $+V_{DD}$ which is inductively coupled to the output node through an inductor L. Inductor L functions to isolate voltage source $V_{DD}$ from AC signals.

A capacitor $C_2$ is provided between the output node of the operational amplifier and an output terminal 130 of the transimpedance amplifier for providing only AC signals at output 130.

Feedback PIN diode 112 is a semiconductor PIN diode comprising an intrinsic semiconductor region interposed between a p-type and an n-type semiconductor regions. A PIN diode possesses an unique characteristic that, under a certain forward bias, the resistance of the PIN diode depends substantially linearly with the inverse of the current passing the PIN diode. Such characteristic of the PIN diode is utilized in the present invention to provide a resistance that varies substantially linearly with the inverse of the optical signal. For details about the structures, fabrication and characteristics of PIN diodes, see, for example, S. M. Sze, "Physics of Semiconductor Devices," 2nd edition, John Wiley & Sons, Inc., 1981, pp. 117–122, which is incorporated herein by reference.

Figure 1B:
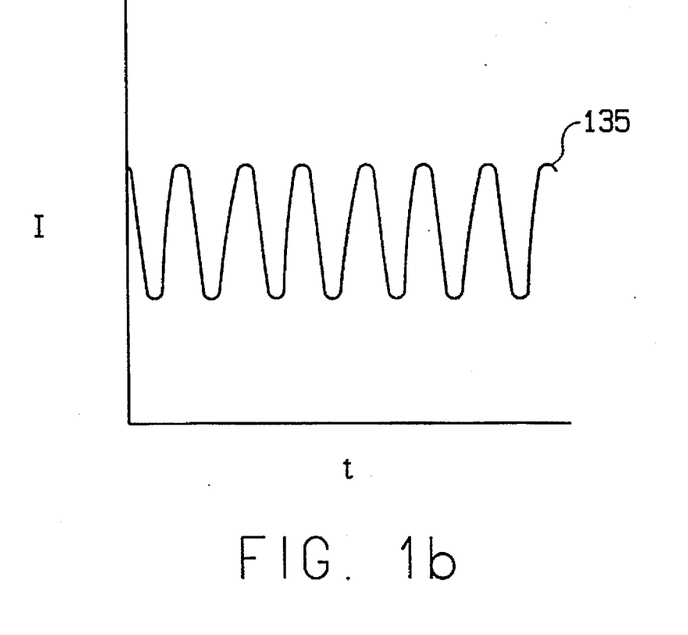
Figure 2:
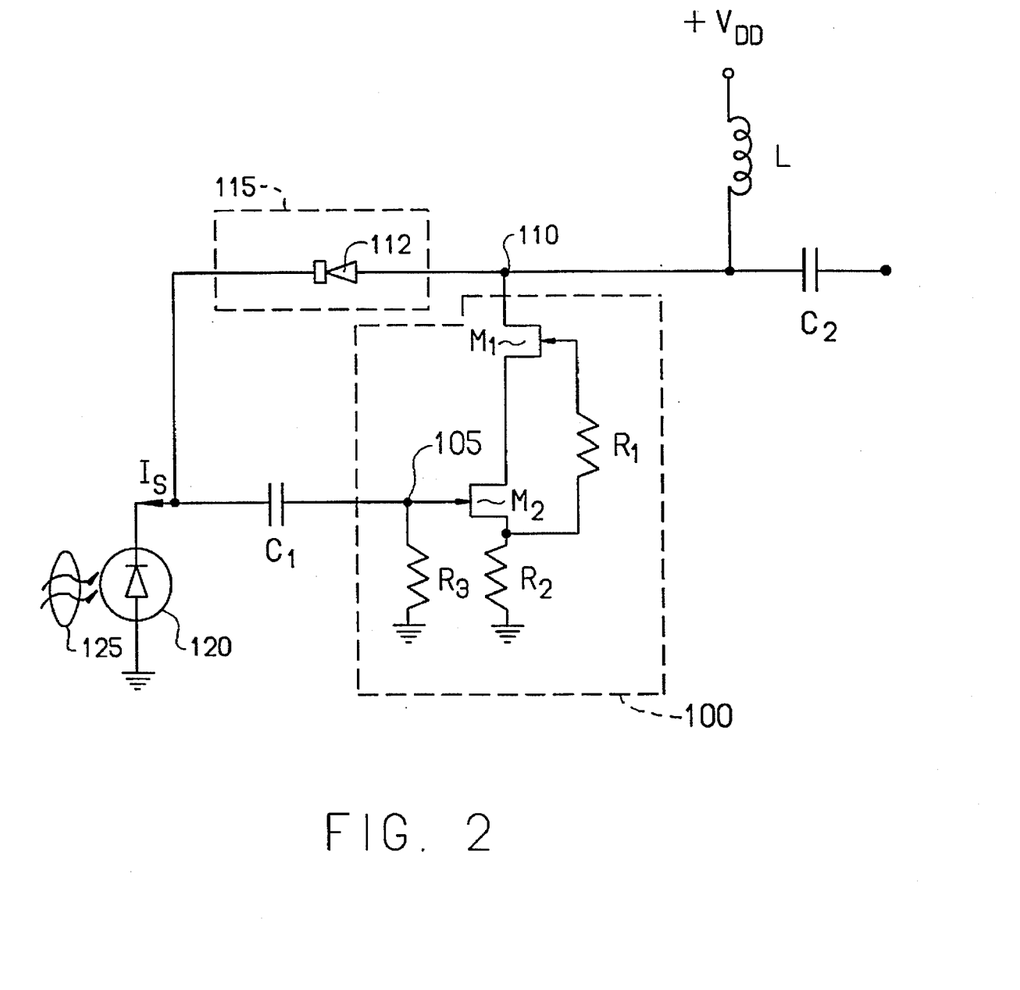

The operation principle for this AGCT amplifier is described as follows: the photodiode is reversed biased and it receives an analog optical signal transmitted via an optical fiber and produces a corresponding current signal $I_s$ having a direction as indicated by the arrow. The analog signal includes a sinsodial carrier signal 135 component as illustrated in FIG. 1b having a frequency $f_C$. When the information to be transmitted is incorporated into the carrier signal, the resulted signal has a waveform 145 illustrated in FIG. 2b. An envelop waveform 140 of waveform 145 represents the information that is transmitted and it has a frequency $f_I$.

In the transimpedance amplifier, nearly all of the current signal $I_s$ passes the feedback PIN diode, whose resistance to the current signal is the diode's dynamic resistance. Due to the parasitic resistance, capacitance and the finite electron velocity in the semiconductor materials that form the PIN diode, the dynamic resistance is incapable of responding to an AC component of the current signal having a frequency greater than a characteristic frequency of the PIN diode. In other words, the dynamic resistance cannot follow high frequency signal if the frequency of the signal is above a characteristic frequency. Such characteristic frequency is approximated as the inverse of the electron lifetime in the intrinsic region of the PIN diode.

Consequently, the dynamic resistance of the PIN diode depends only a DC component of the current signal, which is approximately the average amplitude of the current signal passing the feedback PIN diode over a period of time. The DC component is illustrated as $I_d$ in FIG. 1C.

Figure 1C:
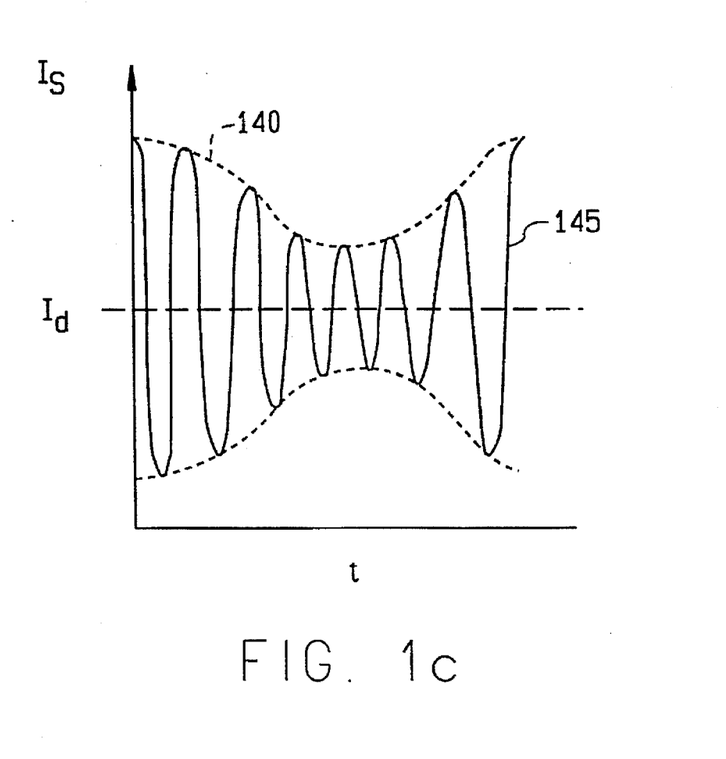

In a typical analog AM application such as transmitting analog TV signal via an optical cables, both the frequency of information signal, $f_I$ (about several MHz), and the carrier signal frequency, $f_C$ (about several hundred MHz), are well-above the characteristic frequency of the feedback PIN diode. Consequently, the dynamic resistance of the PIN diode depends only on the DC component $I_d$ of the current signal $I_s$.

Thus, increasing the amplitude of the input signal increases its DC component, $I_d$, and the DC component of the current passing the feedback PIN diode, which in turn causes the dynamic resistance of the feedback PIN diode to decrease. As a result, the effective feedback resistance is reduced and the amplitudes of the corresponding output voltage signal is controlled to be within a tolerable level. More importantly, the substantial linear dependency between the dynamic resistance of the PIN diode and the inverse of the dc component results in ultra low distortion.

FIG. 2 illustrates a preferred embodiment of the transimpedance amplifier of FIG. 1a. For convenience, like elements are similarly designated throughout the drawings.

In this preferred embodiment, operational amplifier 100 is a single stage inverting voltage amplifier which comprises two field effect transistors (FETs) M1 and M2, and resistors $R_1$, $R_2$ and $R_3$. A single stage voltage amplifier generally provides a better linearity and less distortion than a multistage amplifier.

In this amplifier, FETs M1 and M2 are serially connected along their source-to-drain path and they are DC biased by a single voltage source $V_{DD}$ through inductor L which functions to isolate voltage source $V_{DD}$ from AC signal and to provide an inductive load to the voltage amplifier. Preferably, all of the circuit elements except the photodiode and the feedback PIN diode are integrally fabricated on a single GaAs substrate utilizing GaAs Microwave Monolithic Integrated Circuit (MMIC) technology. The FETs are GaAs FETs which provide a high bandwidth and low distortion. The photodiode and the feedback PIN diode are silicon PIN diodes and they are externally connected to the GaAs chip to form a hybrid circuit.

Another aspect of the invention is that, when the effective feedback resistance is reduced due to increase in the amplitude of the input signal, the AC load impedance as well as the voltage gain of the amplifier is also reduced, which further improves the dynamic range of the amplifier. In addition, reducing the effective feedback resistance also reduces the input impedance to the photodiode, which improves the linearity of the photodiode.

Figure 3:
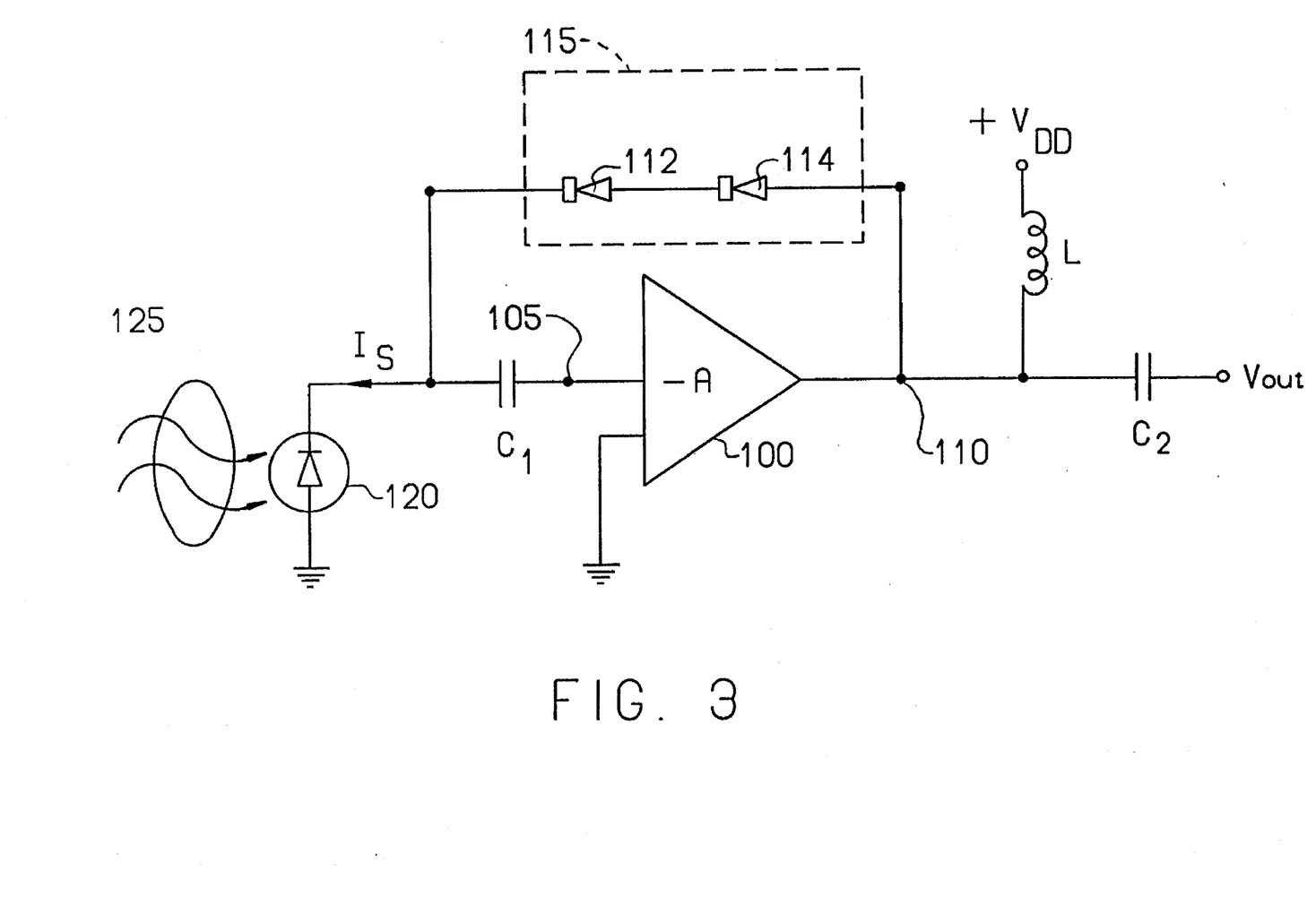

FIG. 3 illustrates an alternative embodiment, which includes a feedback circuit comprising two feedback PIN diode connected in series. Specifically, the two PIN diodes are polarized in the same direction and they are forward biased by the DC voltage supply $+V_{DD}$. As compared to the circuit depicted in FIG. 1, the two serially connected PIN diodes provide a lower capacitance than a single PIN diode, which results in a higher bandwidth.

Figure 4A:
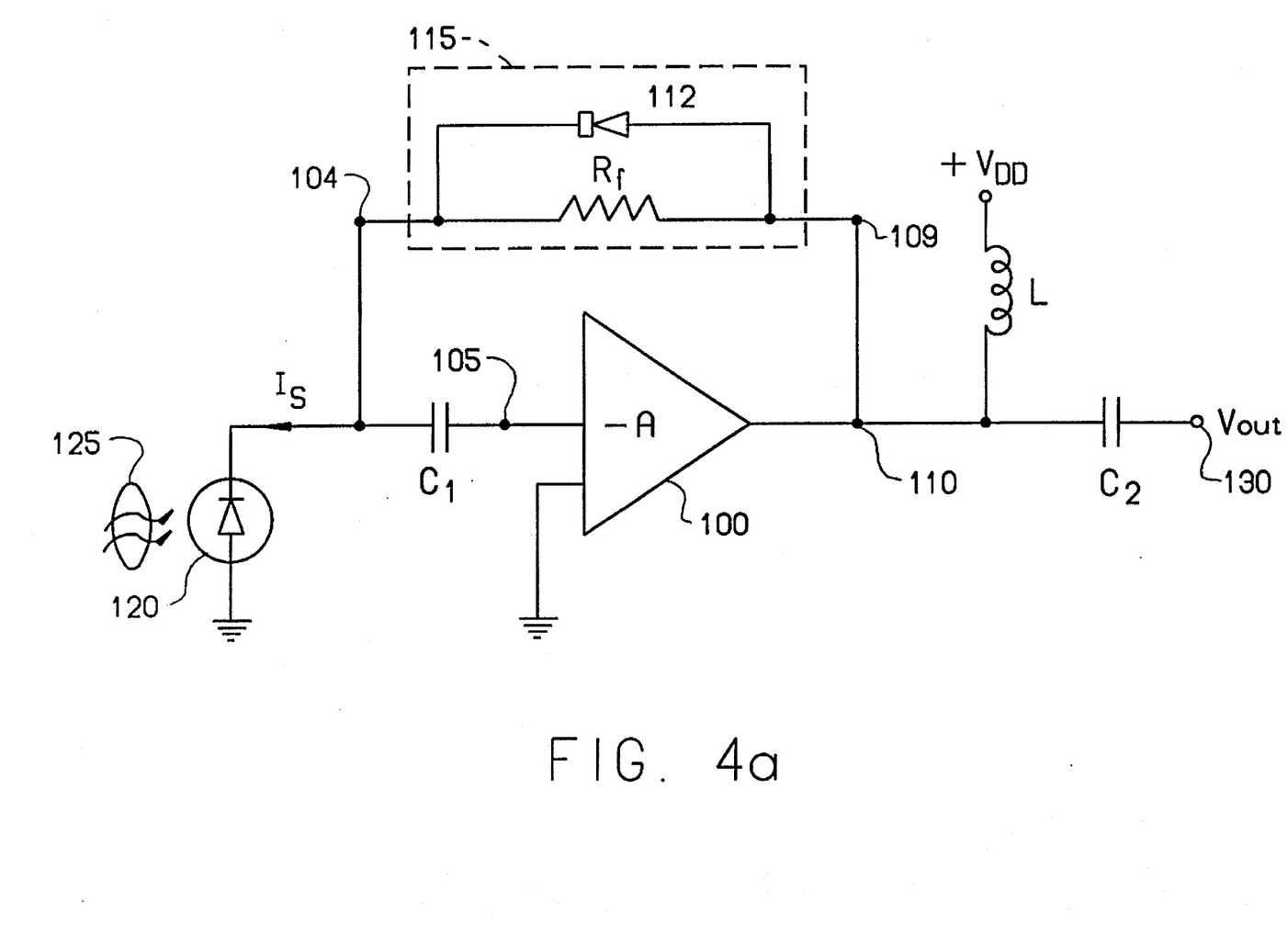
FIG. 4a depicts a schematic circuit diagram of a second embodiment of the transimpedance amplifier of the present invention.

As depicted in FIG. 4a, a second embodiment of the present invention comprises an operational amplifier 100, a photodiode 120 coupled to an input node 105 of the operational amplifier through capacitor $C_1$, and a feedback branch 115. The feedback branch includes a feedback PIN diode 112 connected in parallel to a resistor $R_f$. A DC supply voltage, $+V_{DD}$, is inductively coupled to output node 110 via inductor L. The output voltage at 130 is filtered by capacitor $C_2$.

The operation principle of this transimpedance amplifier is described as follows: An input optical signal produces a corresponding current signal, $I_s$. A portion of $I_s$ passes the feedback PIN diode, whose dynamic resistance is substantially linearly dependent on the inverse of a DC component of the current passing the feedback PIN diode. As a result, increasing the amplitude of the input optical signal increases the DC component, which reduces the dynamic resistance of the PIN diode and the effective feedback resistance of the amplifier.

Figure 4B:
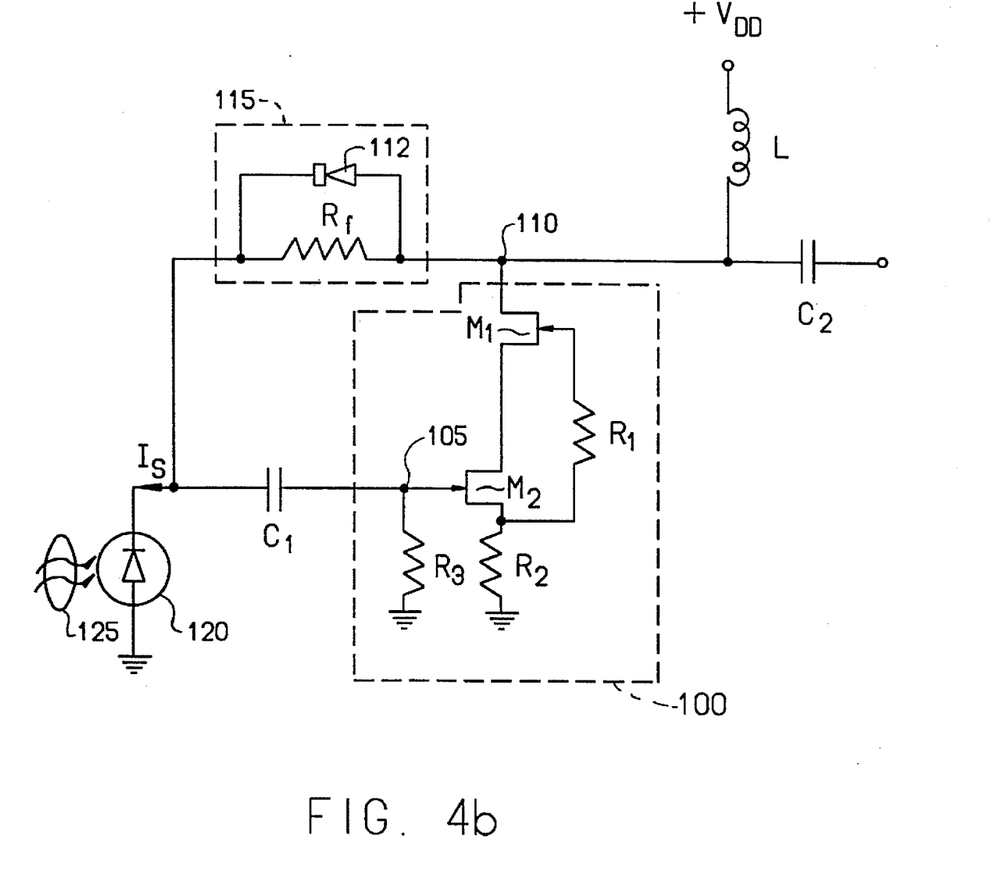

A preferred embodiment of the transimpedance amplifier is illustrated in FIG. 4b. Except the photodiode and the feedback PIN diode, the other components of transimpedance amplifier are integrally fabricated on a GaAs substrate. The FETs M1 and M2 are GaAs FETs which have wide bandwidth and low noise. The following is a list of the values of the resistors (R), capacitors (C), inductors (L), and gate-width (W) of FETs that are utilized in this transimpedance amplifier:

| | | |
|---|---|---|
| $R_1 = 10\Omega$ | $R_2 = 6\Omega$ | $R_3 = 10\ k\Omega$ |
| $R_f = 500\Omega$ | $C_1 = 41.4\ pF$ | $C_2 = 0.1\ \mu F$ |
| $L = 2\ \mu H$ | $W_1 = 2500\ \mu m$ | $W_2 = 3800\ \mu m$ | where $W_1$ and $W_2$ are the gate-width for the first FET, M1, and second FET, M2, respectively. The gate length of each FET is 0.5 μm. In this circuit, a single DC voltage supply $V_{DD}$ of +5 V is utilized.

Preferably, the value of the dynamic resistance of the PIN diode is chosen to be comparable to that of the feedback resistor, $R_f$, so that changing of the dynamic resistance of the PIN diode can effectively effectuate the overall feedback resistance of the feedback branch. As an example, the value of the feedback PIN diode dynamic resistance may be chosen to be 1000 Ω whereas the resistance of feedback resistor, $R_f$, is 500 Ω.

The above-described transimpedance amplifier exhibits a bandwidth of 350 MHz and a dynamic range of approximately −10 dBm to +5 dBm which corresponds to input current of 0.1 mA to 5 mA. Regarding its linearity, the transimpedance amplifier displays a second order intercept point, derived from a two-tone test, of more than 40 dBm. As well known to those skilled in the art, intercept point is a useful measure of a device's or circuit's total non-linearity; it is normally independent of the input signal power. Higher value of the intercept point (in dbm) represents less non-linearity of the device or circuit under test.

A two-tone test is a test devised to measure the total non-linearity of circuits or devices. During the test, two input sinusoidal signals having equal power but at different frequencies, $f_1$ and $f_2$, respectively, are first combined and then applied to the device or circuit under test. The output power at frequency $f_1$ or $f_2$, $P_{(out,\ f1)}$ or $P_{(out,\ f2)}$, is then measured. By varying the input signal power, $P_{in}$, and measuring, for example, $P_{(out,\ f1)}$, a first curve, $P_{(out,\ f1)}$ (dbm) v. $P_{in}$ (dbm) is thus obtained.

Next, the output power at one of the intermodulation frequencies ("$f_{IM}$"), $P_{(out,\ FIM)}$, is measured. The intermodulation frequency, $f_{IM}$, may be, assuming $f_1 > f_2$, $(f_1+f_2)$, $(f_1-f_2)$, $(2f_1-f_2)$, $2f_1+f_2$, etc. By varying $P_{in}$ and measuring $P_{(out,\ FIM)}$, a second curve, $P_{(out,\ FIM)}$ (dbm) v. $P_{in}$, is obtained.

The first and second curves are then plotted in a single drawing and the curves are extrapolated towards the higher $P_{in}$ region where the two curves intercept each other. At the interception, the output power, $P_{(out,\ FIM)}$, equals to the input power, $P_{in}$; the input power at the interception is called the intercept point. More particularly, the intercept point derived from the measurement of output power at IM frequencies, $(f_1+f_2)$ or $(f_1-f_2)$, is called a second order intercept point (IIP2); the intercept point derived from IM frequencies, $(2f_1-f_2)$, $(2f_2-f_1)$, $(2f_2+f_2)$, or $(2f_2+f_1)$, is called a third order intercept point (IIP3).

Figure 5A:
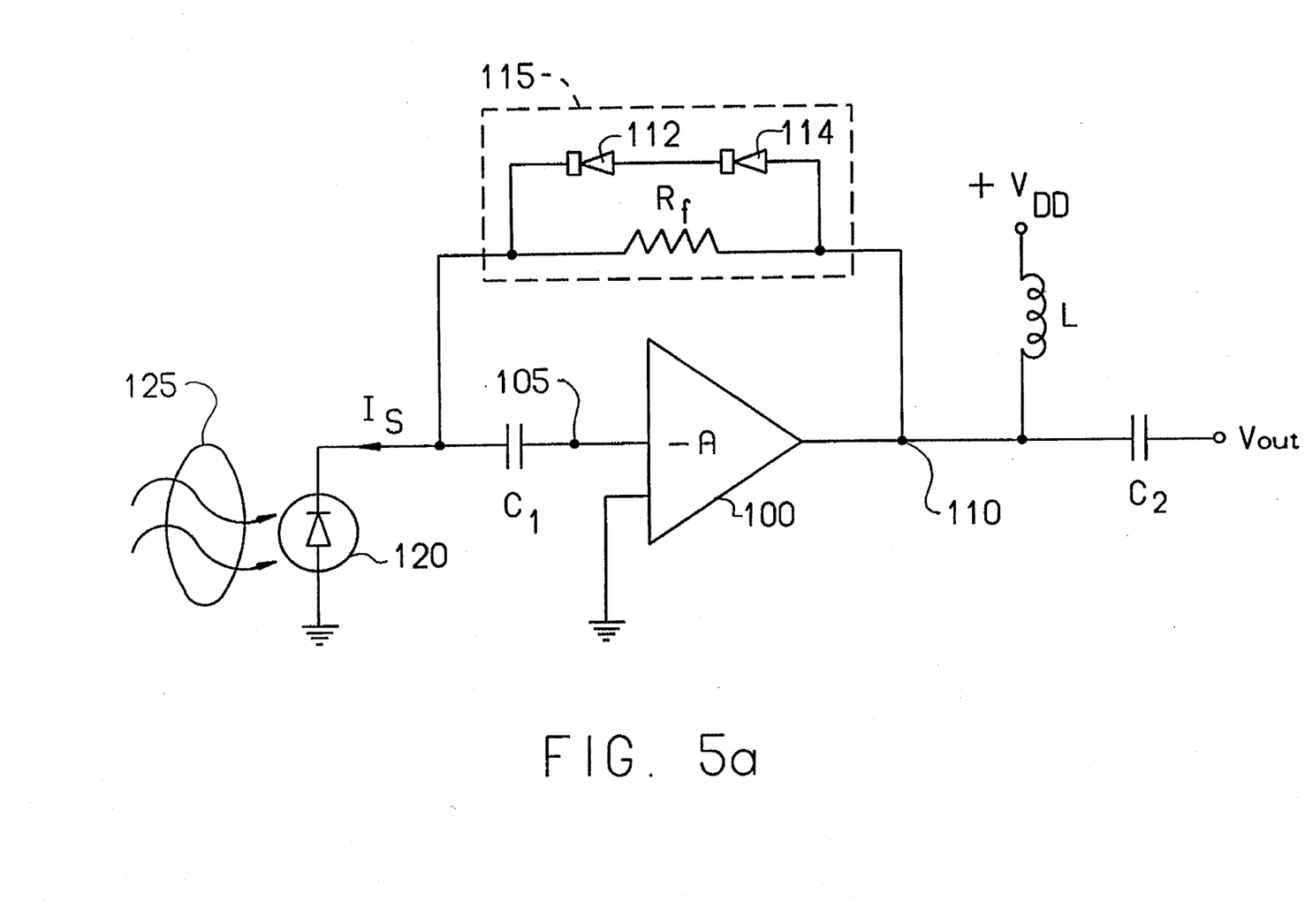
FIGS. 5a–5b illustrate a third embodiment of the present invention and its preferred circuit diagram, respectively.

A third embodiment of the present invention is illustrated in FIG. 5a, which comprises similar elements as the second embodiment except that, in feedback branch 115, it comprises two feedback PIN diodes 112 and 114 connected in series, and the serially connected PIN diodes are connected to feedback resistor $R_f$ in parallel. The direction of polarization of the two feedback PIN diodes are arranged to be the same direction; and the two diodes are forward biased during operation. As compared to the second embodiment, the third embodiment offers a higher bandwidth because of the serially connected feedback PIN diodes has less capacitance as compared to s single PIN diode.

Figure 5B:
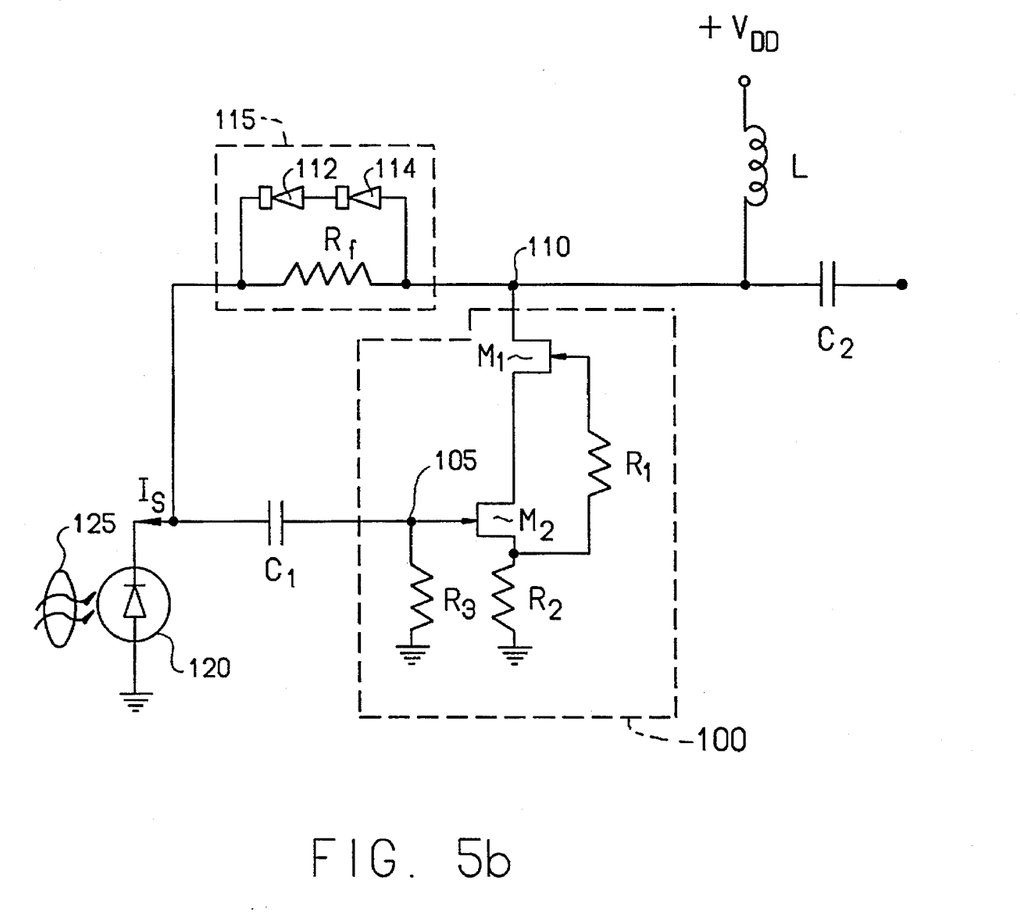

FIG. 5b depicts a preferred embodiment of the transimpedance amplifier of FIG. 5a. The values or parameters for resistors, capacitors, inductor and transistors are the same as that of the second embodiment, thus not listed here. As a result of the reduced capacitance, the bandwidth of the preferred embodiment is about 700 MHz, as compared to 350 MHz for the circuit depicted in FIG. 4b.

In the above description, GaAs FETs are used as examples for the FETs in the operational amplifier. As known to those skilled in the art, the FETs utilized in the operational amplifiers are not limited to GaAs FETs. Other types of FETs such as silicon FETs, or heterojunction FETs based on materials such as AlGaAs/GaAs, AlGaAs/InGaAs, or AlInAs/InP may also be utilized in forming the operational amplifier.

As will be apparent to those skilled in the art, numerous modifications may be made within the scope of the invention, which is not intended to be limited except in accordance with the following claims.

What is claimed is:

1. An automatic gain control transimpedance amplifier comprising:

an operational amplifier having input and output nodes;

a photodiode having one end operatively coupled to the input node of said operational amplifier, said photodiode receiving input optical signal and providing corresponding current signal; and feedback means operatively coupled between the input and output nodes of said operational amplifier, said feedback means comprising a feedback PIN diode forward biased by a DC supply voltage inductively coupled to said output node of said voltage amplifier, said feedback means providing a feedback resistance that is substantially linearly dependent on the inverse of a DC component of said current signal, whereby increasing the amplitude of said optical signal increases said DC component, thereby reducing said feedback resistance.

2. The transimpedance amplifier of claim 1 further comprising a capacitive filtering means operatively coupled between the input node of said operational amplifier and said photodiode and said feedback means.

3. The transimpedance amplifier of claim 1 wherein said operational amplifier comprises a single-stage inverting voltage amplifier, whereby increasing the amplitude of said optical signal reduces the feedback resistance while simultaneously reducing the voltage gain of said inverting voltage amplifier and the input impedance to the photodiode.

4. The transimpedance amplifier of claim 3 wherein said single-stage inverting voltage amplifier comprises first and second field effect transistors (FETs) serially connected along their drain-to-source paths with the drain terminal of said second FET operatively connected to the source terminal of said first FET, the drain terminal of said first FET being operatively connected to said output node of said operational amplifier, the gate terminal of said second FET being connected to said input node of said operational amplifier, the gate terminal of said first FET being resistively coupled to the source terminal of said second FET through a first resistive means, and the source terminal of said second transistor being resistively coupled to a ground potential through a second resistive means.

5. The transimpedance amplifier of claim 4 wherein said voltage amplifier further comprises a third resistive means connected between the gate terminal of said second transistor and said ground potential.

6. The transimpedance amplifier of claim 5 wherein said FETs are GaAs FETs.

7. The transimpedance amplifier of claim 1 wherein said photodiode is a PIN photodiode.

8. An automatic gain control transimpedance amplifier comprising:

an operational amplifier having input and output nodes;

a photodiode having one end operatively coupled to the input node of said operational amplifier, said photodiode receiving input optical signal and providing corresponding current signal; and feedback means operatively coupled between the input and output nodes of said operational amplifier, said feedback means comprising two feedback PIN diodes connected in series, each of said PIN diodes being forward biased, said feedback PIN diodes being forward biased by a DC supply voltage inductively coupled to said output node of said operational amplifier, said feedback means providing a feedback resistance that is substantially linearly dependent on the inverse of a DC component of said current signal, whereby increasing the amplitude of said optical signal increases said DC component, thereby reducing said feedback resistance.

9. An automatic gain control transimpedance amplifier comprising:

an operational amplifier having input and output nodes;

a photodiode having one end operatively coupled to the input node of said operation amplifier, said photodiode receiving input optical signal and providing a corresponding current signal; and a feedback branch operatively coupled between the input and output nodes of said operational amplifier, said feedback branch comprising a feedback resistive means connected in parallel to a forward biased feedback PIN diode having a dynamic resistance substantially linearly dependent on the inverse of a DC component of the current passing said PIN diode, said feedback PIN diode being forward biased by a DC supply voltage inductively coupled to said output node of said voltage amplifier, whereby increasing the amplitude of said optical signal increases the amplitudes of the DC component, thereby reducing the dynamic resistance of said feedback PIN diode, and thereby reducing an effective feedback resistance of said feedback branch.

10. The transimpedance amplifier of claim 9 wherein said photodiode is a PIN photodiode.

11. The transimpedance amplifier of claim 9 further comprises a capacitive filtering means operatively coupled between the input node of said operational amplifier and said photodiode and said feedback branch.

12. The transimpedance amplifier of claim 9 wherein said operational amplifier comprises a single-stage inverting voltage amplifier, whereby increasing the amplitude of said input optical signal reduces the dynamic resistance of said feedback PIN diode, thereby reducing the effective feedback resistance of said feedback branch while simultaneously reducing the voltage gain of said inverting voltage amplifier and the input impedance of said photodiode.

13. The transimpedance amplifier of claim 12 wherein said single-stage inverting voltage amplifier comprises first and second field effect transistors (FETs) serially connected along their drain-to-source path with said drain terminal of said second FET operatively connected to said source terminal of said first FET, the drain terminal of said first FET being operatively connected to said output node of said operational amplifier, the gate terminal of said second FET being connected to said input node of said operational amplifier, the gate terminal of said first FET being resistively coupled to the source terminal of said second FET through a first resistive means, and the source terminal of said second transistor being resistively coupled to a ground potential through a second resistive means.

14. The transimpedance amplifier of claim 13 wherein said voltage amplifier further comprises a third resistive means connected between the gate terminal of the second FET and the ground potential.

15. The transimpedance amplifier of claim 13 wherein said FETs are GaAs FETs.

16. An automatic gain control transimpedance amplifier comprising:

an operational amplifier having input and output nodes;

a photodiode having one end operatively coupled to said input node of said operation amplifier, said photodiode receiving input optical input signal and producing corresponding current signal; and a feedback branch coupled between said input and output nodes of said operational amplifier, said feedback branch comprising a feedback resistive means connected in parallel to serially connected, forward biased first and second feedback PIN diodes, said feedback PIN diodes being forward biased by a DC supply voltage inductively coupled to said output node of said voltage amplifier, whereby increasing the amplitude of said input optical signal increases the amplitude of a DC component of the current passing said PIN diodes, thereby reducing the dynamic resistance of said feedback PIN diodes and the feedback resistance of said feedback branch.

17. The transimpedance amplifier of claim 16 wherein said photodiode is a PIN photodiode.

18. The transimpedance amplifier of claim 16 further comprising a capacitive filtering means operatively coupled between said input node of said operational amplifier and said photodiode and said feedback branch.

19. The transimpedance amplifier of claim 16 wherein said operational amplifier comprises a single-stage inverting voltage amplifier, whereby increasing the amplitude of said DC component of said input optical signal reduces the dynamic resistance of said feedback PIN diode, thereby reducing the effective feedback resistance of said feedback branch as well as reducing the voltage gain of said inverting voltage amplifier.

20. The transimpedance amplifier of claim 19 wherein said single-stage inverting voltage amplifier comprises first and second field effect transistors (FETs) serially connected along their drain-to-source path with said drain terminal of said second FET operatively connected to said source terminal of said first FET, the drain terminal of said first FET being operatively connected to said output node of said operational amplifier, the gate terminal of said second FET being connected to said input node of said operational amplifier, the gate terminal of said first FET being resistively coupled to the source terminal of said second FET through a first resistive means, and the source terminal of said second transistor being resistively coupled to a ground potential through a second resistive means.

21. The transimpedance amplifier of claim 20 wherein said voltage amplifier further comprises a third resistive means connected between the gate terminal of said second transistor and said ground potential.

22. The transimpedance amplifier of claim 20 wherein said FETs are GaAs FETs.

23. A transimpedance amplifier comprising:

an operational amplifier having input and output nodes; and feedback means operatively coupled between the input and output nodes of said operational amplifier, said feedback means comprising a feedback PIN diode forward biased by a DC supply voltage inductively coupled to the output node of said amplifier, said operational amplifier comprising a single-stage inverting voltage amplifier, said single-stage inverting voltage amplifier comprising first and second field effect transistors (FETs) serially connected along their drain-to-source paths with the drain terminal of said second FET operatively connected to the source terminal of said first FET, the drain terminal of said first FET being operatively connected to said output node of said operational amplifier, the gate terminal of said second FET being connected to said input node of said operational amplifier, the gate terminal of said first FET being resistively coupled to the source terminal of said second FET through a first resistive means, and the source terminal of said second transistor being resistively coupled to a ground potential through a second resistive means.

24. The transimpedance amplifier of claim 23 wherein said voltage amplifier further comprises a third resistive means connected between the gate terminal of said second transistor and said ground potential.

25. The transimpedance amplifier of claim 23 wherein said FETs are GaAs FETs.

26. A transimpedance amplifier comprising:

an operational amplifier having input and output nodes; and feedback means operatively coupled between the input and output nodes of said operational amplifier, said feedback means comprising two feedback PIN diodes connected in series, said feedback PIN diodes being forward biased by a DC supply voltage inductively coupled to said output node of said operational amplifier, said operational amplifier comprising a single-stage inverting voltage amplifier, said single-stage inverting voltage amplifier comprising first and second field effect transistors (FETs) serially connected along their drain-to-source paths with the drain terminal of said second FET operatively connected to the source terminal of said first FET, the drain terminal of said first FET being operatively connected to said output node of said operational amplifier, the gate terminal of said second FET being connected to said input node of said operational amplifier, the gate terminal of said first FET being resistively coupled to the source terminal of said second FET through a first resistive means, and the source terminal of said second transistor being resistively coupled to a ground potential through a second resistive means.

27. The transimpedance amplifier of claim 26 wherein said voltage amplifier further comprises a third resistive means connected between the gate terminal of said second transistor and said ground potential.

28. The transimpedance amplifier of claim 26 wherein said FETs are GaAs FETs.

* * * * *